United States Patent
Sievers et al.

(10) Patent No.: US 6,949,932 B2
(45) Date of Patent: Sep. 27, 2005

(54) METHOD FOR MONITORING A POWER SUPPLY OF A CONTROL UNIT IN A MOTOR VEHICLE

(75) Inventors: Falko Sievers, Wannweil (DE); Hartmut Schumacher, Freiberg (DE); Peter Taufer, Renningen (DE); Jochen Seibold, Tuebingen (DE); Harald Tschentscher, Grossbottwar (DE); Gerald Nitsche, Gammertingen (DE)

(73) Assignee: Robert Bosch GmbH, Stuttgart (DE)

( * ) Notice: Subject to any disclaimer, the term of this patent is extended or adjusted under 35 U.S.C. 154(b) by 23 days.

(21) Appl. No.: 10/343,813

(22) PCT Filed: May 29, 2002

(86) PCT No.: PCT/DE02/01974

§ 371 (c)(1),
(2), (4) Date: Sep. 2, 2003

(87) PCT Pub. No.: WO02/099444

PCT Pub. Date: Dec. 12, 2002

(65) Prior Publication Data

US 2004/0017205 A1 Jan. 29, 2004

(30) Foreign Application Priority Data

Jun. 2, 2001 (DE) .......................................... 101 27 054

(51) Int. Cl.$^7$ ............................................. G01R 31/08
(52) U.S. Cl. ........................... 324/522; 701/31; 714/47
(58) Field of Search ........................ 324/522; 701/31; 714/27, 47

(56) References Cited

U.S. PATENT DOCUMENTS

| | | | | |
|---|---|---|---|---|
| 4,118,688 A | * | 10/1978 | Glennon | ................... 340/516 |
| 4,597,052 A | | 6/1986 | Matsuda | |
| 4,694,408 A | | 9/1987 | Zaleski | |
| 5,875,293 A | * | 2/1999 | Bell et al. | ................... 714/27 |

FOREIGN PATENT DOCUMENTS

| | | |
|---|---|---|
| DE | 39 28 537 | 3/1991 |
| DE | 44 33 745 | 3/1995 |
| DE | 44 36 372 | 4/1996 |
| DE | 198 18 315 | 9/1999 |
| EP | 1 001 257 | 5/2000 |

* cited by examiner

Primary Examiner—Anjan Deb
Assistant Examiner—Timothy J. Dole
(74) Attorney, Agent, or Firm—Kenyon & Kenyon

(57) ABSTRACT

In a method of monitoring a voltage supply of a control unit in a motor vehicle, a supply module which provides the voltages is connected to the components of the control unit via a RESET line and the RESET line is tested every time the control unit is started or all monitoring limits of the supply module show no fault again after the faults of the monitored voltages have been filtered. This test occurs by forced periodic pulses which are generated on the basis of a shift in the limits of the monitoring bands of the supply voltages. The reference voltages VREGUL and VREF are kept independent of each other here in order to prevent system perturbations.

10 Claims, 4 Drawing Sheets

METHOD FOR MONITORING A POWER SUPPLY OF A CONTROL UNIT IN A MOTOR VEHICLE

FIELD OF THE INVENTION

The present invention relates to a method for monitoring a voltage supply of a control unit in a motor vehicle.

BACKGROUND INFORMATION

In other systems, a voltage supply of a control unit faults may be recognized in the voltages used for supplying the components of the control unit, and then the function of the components of the control unit may be interrupted via a RESET line from a supply module, resulting in a shutdown. The voltages are monitored for faults using bands around a specified quantity.

German Published Patent Application No. 44 36 372 discusses a circuit arrangement for an electronic regulating system for motor vehicles, where monitoring of the power supply is provided. If a fault is detected, the regulation is switched over or switched off. An interrupt signal to a monitoring processor is taken into account in the analysis of the monitoring signals. Signal lines are provided, which conduct monitoring signals and test signals to a logic. German Published Patent Application No. 39 28 537 discusses a CAN bus, which connects control units to one another. The resettability of a bus module is monitored. The reset procedure is performed repeatedly in a loop. A time-out counter defines the reset time. Within this time, a check determines whether the reset status has been set. German Patent No. 198 18 315 discusses the provision of independent reference voltages. A supply module generates the required voltages and is resettable.

SUMMARY OF THE INVENTION

The method for monitoring a voltage supply of a control unit in a motor vehicle according to the present invention may provide that a test of the RESET line is performed, this may allow for a safe simulation of a fault. This provides the information that the monitoring circuit is active and results in increased dependability of the control unit function. This method is applicable in particular in those cases where more than one supply voltage is to be provided by the supply module, such as 5 V, 3.3 V, and 1.8 V, for example.

In testing the RESET line, the limits of the bands used to monitor the supply voltages are alternately shifted over and below the specified value, so that a RESET is forced. This makes the effect clear for the processor, and the processor counts the time of the duration of a RESET pulse, this may allow for checking of the operation of the RESET line. Both limits are tested and this may increase the dependability of the method according to the present invention.

In addition, the method according to the present invention is executed when starting up a control unit, so that operability is always monitored when starting operation.

The components of the control unit which are stopped in the event of a fault do not become active again until the supply module signals no faults for all of its monitoring functions; this accomplishes the result that the control unit only operates when no fault is present. This is useful in safety-relevant systems such as restraint systems for preventing malfunctions.

At least two independent voltages are provided, the first being used for regulation and the second for monitoring. This rules out a fault which affects only one of the voltages having an effect on the other voltage thus causing the fault to propagate. In order to generate two independent voltages, either two voltage sources isolated from one another or one voltage source including two impedance transformers connected are required.

On failing the RESET line test, a warning or blocking of the control unit function is performed. This prevents a defective control unit from causing dangerous situations, which is of interest in particular in the case of control units for restraint systems.

A control unit including the arrangement for executing the method according to the present invention is provided.

DETAILED DESCRIPTION

In safety-relevant systems in motor vehicles including integrated control units, the supply voltages to be supplied must be monitored in order to guarantee proper operation of the control unit components only at supply voltages which are within predefined parameters.

According to the present invention, a method of monitoring a voltage supply to a control unit in a motor vehicle is described, in which a fault may be safely simulated during a test. The test is performed with each startup of the control unit, a test of the RESET line being executed by manner of which the function of control unit components may be interrupted. The test is initiated by a supply module of the control unit, so that the RESET line interrupts the components and the control unit processor for a predefined time period using periodic pulses. The processor counts the time between the interrupts in order to monitor the operation of the RESET line.

Figure 1:
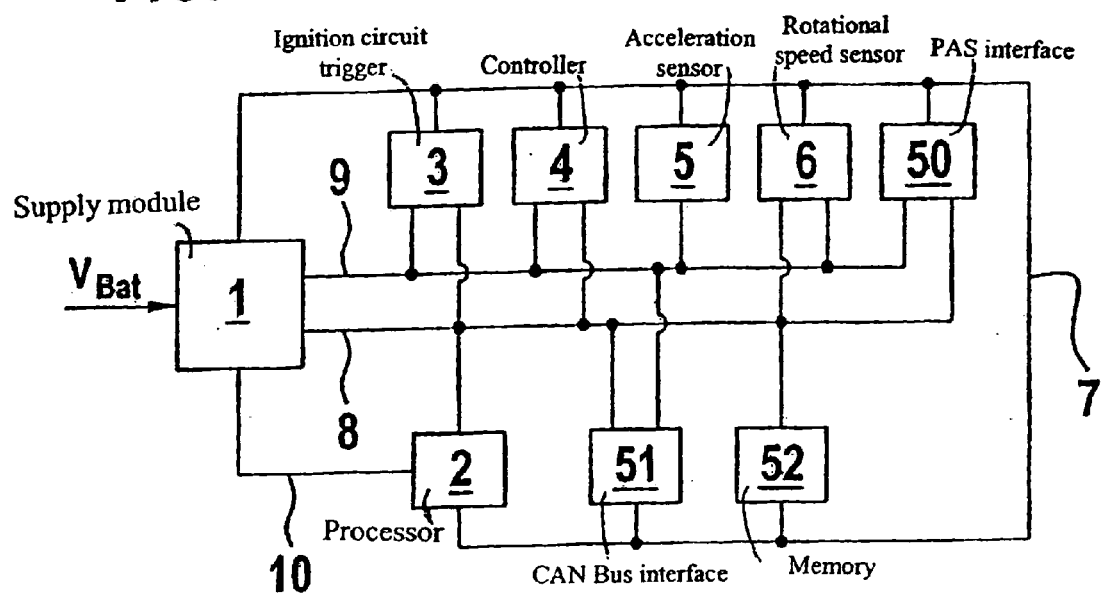
FIG. 1 shows a block diagram of the control unit according to the present invention.

FIG. 1 shows the control unit according to the present invention in the form of a block diagram. A supply module 1 is supplied with the required electric power by a battery voltage VBATT to provide the predefined voltages for the individual components of the control unit. Supply module 1 is connected to an acceleration sensor 5, a rotational speed sensor 6, a controller 4, an ignition circuit trigger 3, a PAS (peripheral acceleration sensor) interface 50, and a CAN (controller area network) bus interface 51 via a first electrical power supply line 9. PAS sensors are acceleration sensors distributed in the vehicle, for example, for side impact sensing.

Power supply line 9 has a voltage of 5 V. In addition, supply module 1 is connected to all components of the control unit via a RESET line 7. Supply module 1 is connected to ignition circuit trigger 3, controller 4, PAS interface 50, CAN bus interface 51, a processor 2, and a memory 52 via a second power supply line 8. Power supply line 8 has a supply voltage of 3.3 V. Supply module 1 is connected to processor 2 via a third power supply line 10, which has a voltage of 1.8 V. The processor core and the memory core of processor 2 are supplied with voltage here in particular. Individual power supply lines 8, 9, and 10 may also be connected to further components such as interfaces, sensors, and memories. More or less than three supply voltages may also be provided by supply module 1, and different components may be simultaneously connected to different voltage supply lines.

Supply module 1 converts battery voltage VBATT into the supply voltages that are required for the control unit components. This means that 5 V, 3.3 V, and 1.8 V are generated from the battery voltage. Data connections that concern the functions of the individual components are not shown. Control lines are also not shown. After power-on, a test is automatically initiated in supply module 1. Here this test concerns RESET line 7 in particular, to which the individual components of the control unit are connected. This ensures that, in the event of a fault in the voltage supply, the components are stopped, so that the control unit will not issue erroneous signals which might result in dangerous situations in the motor vehicle.

After all three voltages 5 V, 3.3 V, and 1.8 V are within their monitoring windows for the first time or again, a fixed sequence controller in supply module 1 starts the test of supply module 1. This allows for monitoring of the test step-by-step via RESET line 7. Since the system, i.e., all components of the control unit, are simultaneously stopped via this line 7, it is also possible to monitor, and ultimately to confirm, the proper effect of the reset signals on the system. Supply module 1 generates a RESET pulse, which is transmitted to all components via RESET line 7. This RESET pulse stops the functions of the components for the duration of the pulse. However, a plurality of RESET pulses are used in the test, so that processor 2 is capable of counting the time between the RESET pulses and their frequency in order to establish whether the RESET test is successful. If the RESET test is unsuccessful, a warning is issued, for example, via display devices, and/or the functions of the control unit are blocked. If the test is successful, the control unit is enabled. The RESET pulse sequence may be implemented using a sequence control which includes a shift register.

The RESET pulses are triggered by the fact that the supply voltages, which are monitored via bands having upper and lower limit values, display a fault due to a shift in these limits and thus cause a RESET. Since both the upper and lower limits for each supply voltage are shifted to produce a fault, twice as many tests, i.e., six tests, and thus also six pulses, are required to test all limits of the three supply voltages in this case.

Figure 2:
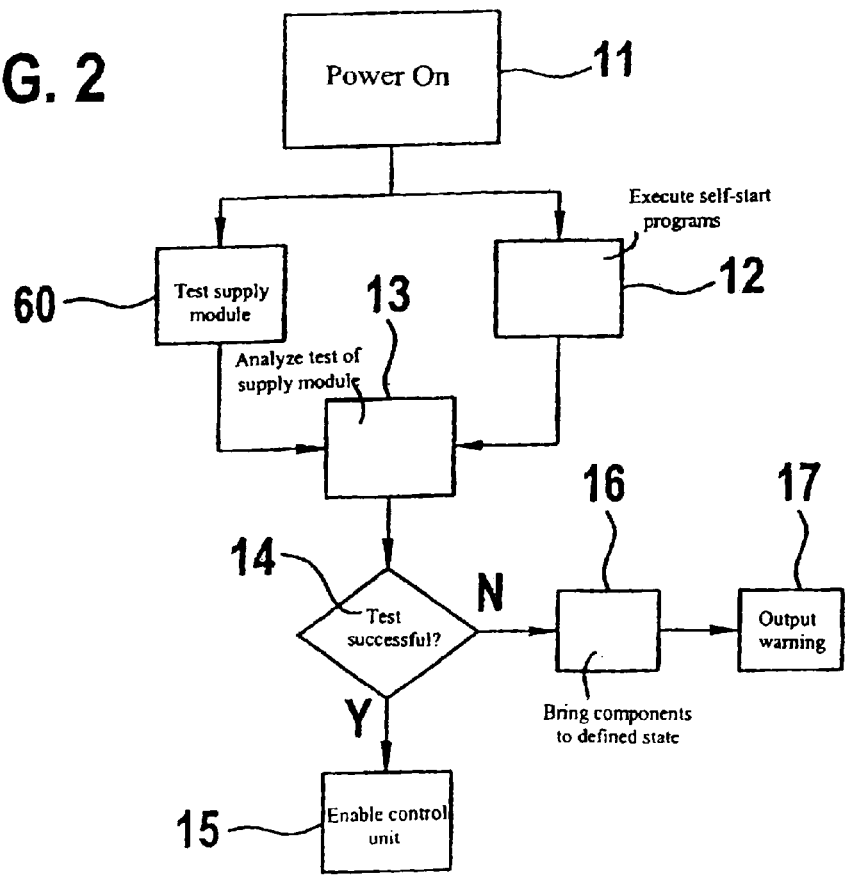
FIG. 2 shows a flow diagram of the method according to the present invention.

FIG. 2 shows a flow diagram of the method according to the present invention. In method step 11 the control unit is powered on. Battery voltage VBATT is then applied. Supply module 1 converts battery voltage VBATT into the required voltages for the components in the control unit. Then, in method step 12, processor 2 executes self-start programs and a pre-initialization for itself and the ICs and/or components in the control unit. At the same time, the test of supply module 1 occurs independently in method step 60 in that a test-specific RESET is generated via RESET line 7. In the event of a major fault, the entire system is blocked, including processors 2, 4, by RESET line 7 (reset-low). In the event of a minor fault, the test of supply module 1 is analyzed in method step 13. Then, if it is determined in method step 14 that the test was successful, the function of the control unit is enabled in method step 15. However, if it was determined in method step 14 that the test was unsuccessful, then in method step 16 the individual components of the control unit are brought to a defined safe state via control lines, for example SPI (serial peripheral interface), and in method step 17 a warning is output and, if appropriate, the functions of the control unit are blocked.

Figure 3:
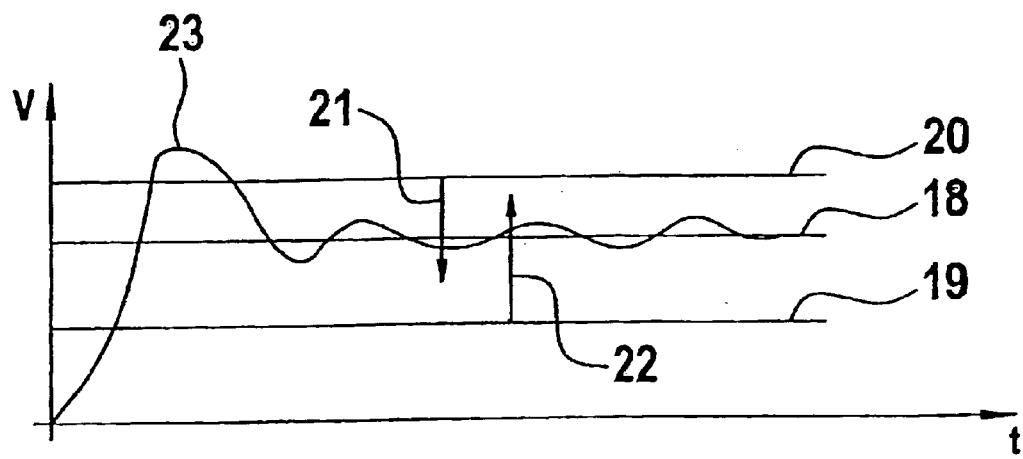
FIG. 3 shows a voltage/time diagram illustrating the variation of a voltage with the limits of a monitoring band and a specified value.

FIG. 3 shows the variation of supply voltage 23 on power-on in the form of a voltage/time diagram. Specified value 18 of an upper limit 20 and a lower limit 19 is given for supply voltage 23, i.e., 5 V, 3.3 V, or 1.8 V. If these limits are exceeded by voltage 23, a fault of the supply voltage exists. After the voltage enters the monitoring window, the test for limits 19 and 20 being exceeded is started after a defined filter time. However, a defined waiting period may be allowed for the supply voltage to reach steady state before the test for limits 19 and 20 being exceeded is started. Reference value Vref, which is equal to specified value 18 but independent of it, is used for the test. For this purpose, in the feedback of the output voltage to the voltage regulator, in addition to the actual voltage, voltage 20, which is greater than the regulating reference (Vregul) and corresponds to the upper band limit, and voltage 19, which is less than the regulating reference and corresponds to the lower band limit, are tapped and compared to independent value Vref 23. If Vref 23 is shifted below the lower band limit, a fault occurs and a RESET pulse is transmitted over RESET line 7. If Vref is shifted above the upper band limit, another fault occurs and another RESET pulse is generated.

Figure 4:
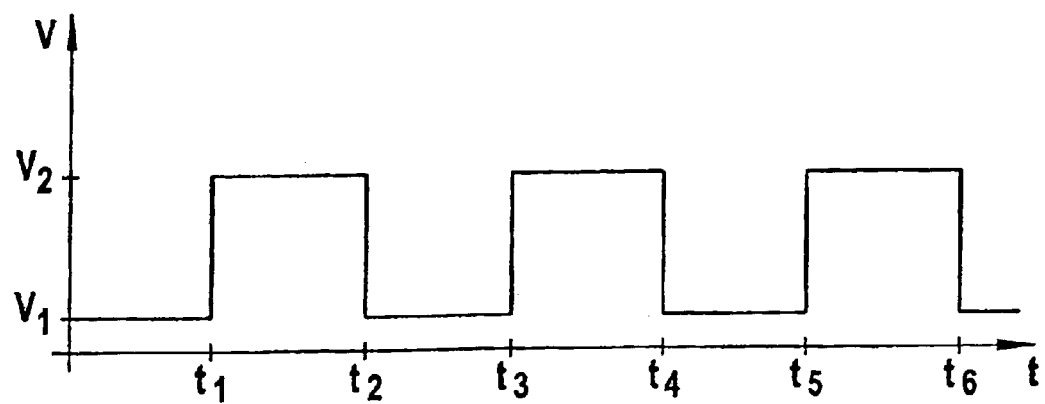
FIG. 4 shows a test sequence of RESET pulses in a voltage/time diagram.

FIG. 4 shows the signals on RESET line 7 in the form of a voltage/time diagram. During the test, RESET pulses which stop the functions of the components are generated. If voltage V1 is applied to RESET line 7, the components of the control unit are enabled. However, if voltage V2 is applied, the functions of the components are stopped. FIG. 4 shows three RESET pulses as an example of this event. The RESET pulses have a duration of t2–t1, t4–t3, and t6–t5. These time differences are always the same. The processor counts the times between t2 and t3 and t4 and t5. If these times are as specified, then the RESET test is successful. The duration of the pulses and the intervals between pulses may be set via hardware in supply module 1 by using delay elements or shift registers.

Figure 5:
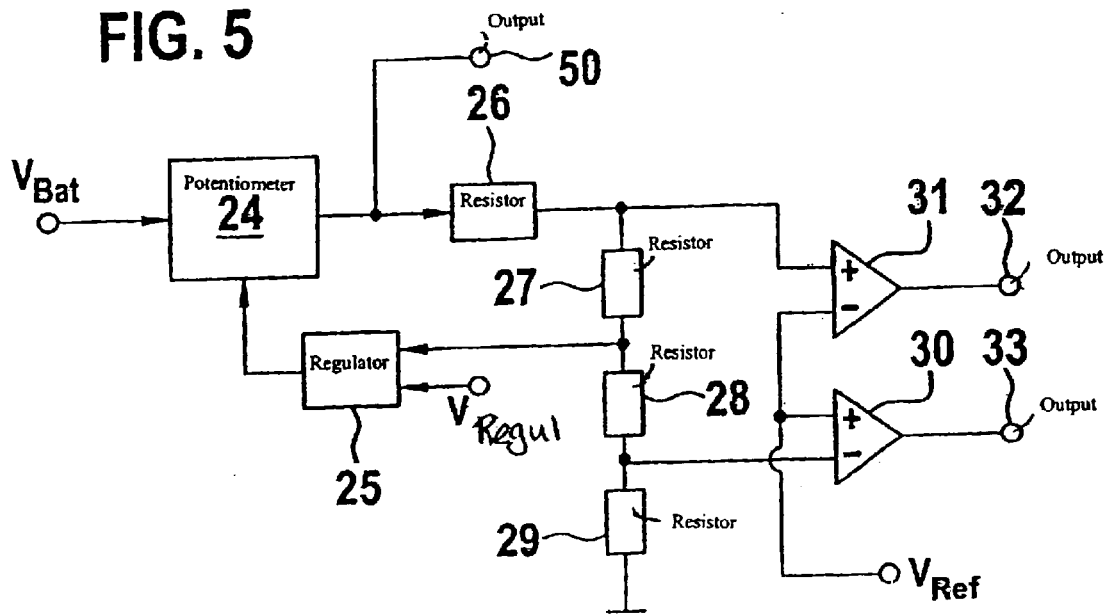
FIG. 5 shows a block diagram of a supply module according to the present invention.

FIG. 5 shows a block diagram of supply module 1 according to the present invention. Battery voltage VBATT is applied to a potentiometer 24, whose second input is connected to a regulator 25, which influences potentiometer 24 as a function of the output signals so that it outputs a predefined output voltage. The output voltage of potentiometer 24 is supplied to a voltage divider, which includes resistors 26, 27, 28, and 29. Resistor 26 and output 50 are connected to the output of potentiometer 24. Resistor 27 and a positive input of a comparator 31 are connected to the other side of resistor 26. The other side of resistor 27 is connected to a first input of regulator 25 and to resistor 28. The other side of resistor 28 is connected to a negative input of a comparator 30 and to resistor 29. The other side of resistor 29 is connected to ground.

The voltages from resistors 26 and 28 to the comparator inputs are compared to a reference voltage Vref. Outputs 32 and 33 of the comparators then issue a low signal when the supply voltage generated here exceeds or drops below the band limits. The supply voltage may be tapped at output 50.

Regulating reference voltage Vregul is furthermore connected to the second input of regulator 25, so that the output voltage of potentiometer 24 is compared here with reference voltage Vregul.

A resistor network as illustrated here, which is used in integrated circuits both for delivering the supply voltage and for the upper and lower band limits, is manufactured in a particularly precise manner with regard to the divider ratios as well as regulator and monitoring accuracies. This configuration, as shown in FIG. 5, may be implemented for each supply voltage. In the case of three supply voltages, three such circuits are used as shown in FIG. 5.

Figure 6:
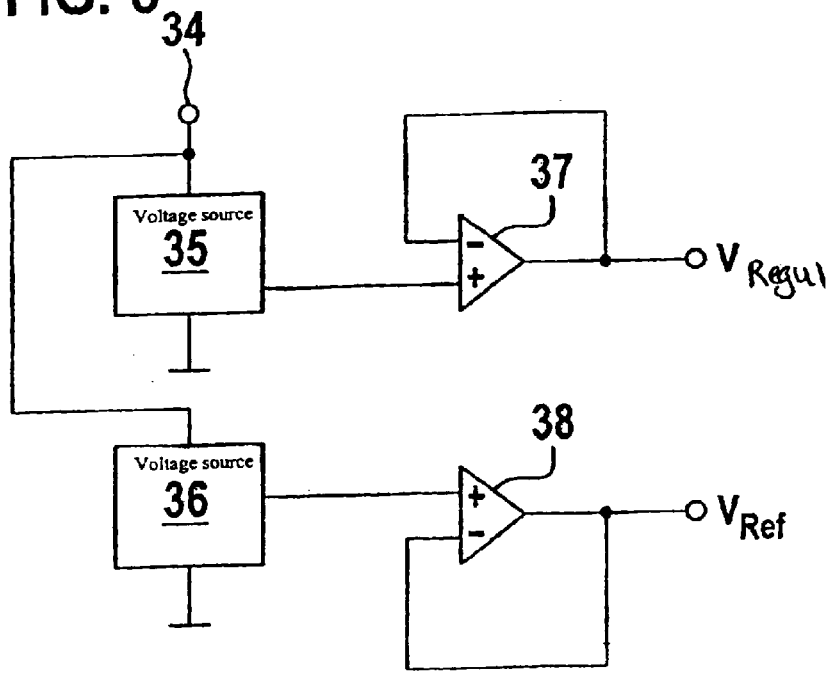
FIG. 6 shows two voltage sources for supplying the regulating voltage and the test voltage.
Figure 7:
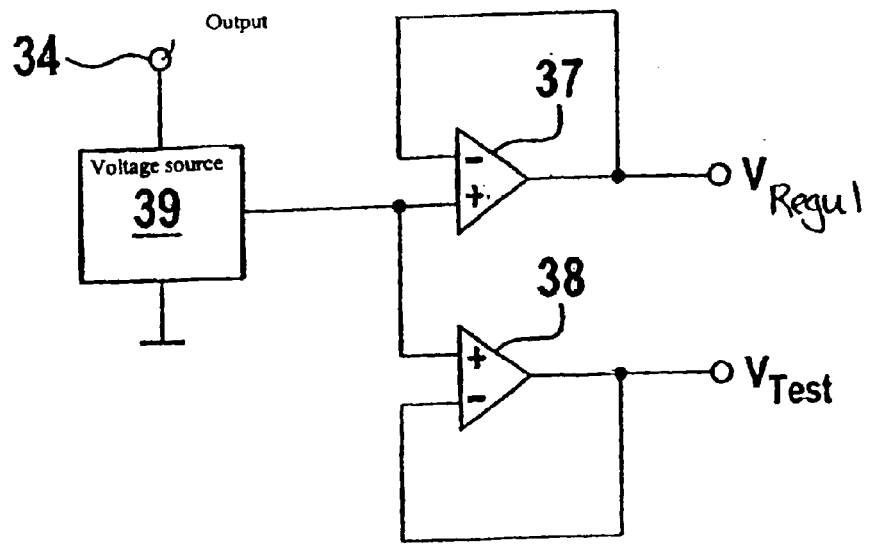
FIG. 7 shows a voltage source including two impedance transformers for supplying the regulating voltage and the test voltage.

FIG. 6 is a block diagram of a circuit for supplying voltages Vregul and Vref. It has two voltage sources 36 and 35, which are connected in parallel between a pre-stabilized voltage 34 and ground, and are connected to positive inputs of operational amplifiers 37 and 38, respectively, the outputs of operational amplifiers 37 and 38 being looped back to the negative inputs. This results in an impedance converter, and voltages Vregul and Vref, applied to the particular outputs, are independent of one another. As FIG. 7 shows, this may also be implemented using one voltage source 39, whose output voltage is then connected to the positive inputs of operational amplifiers 37 and 38.

Figure 8:
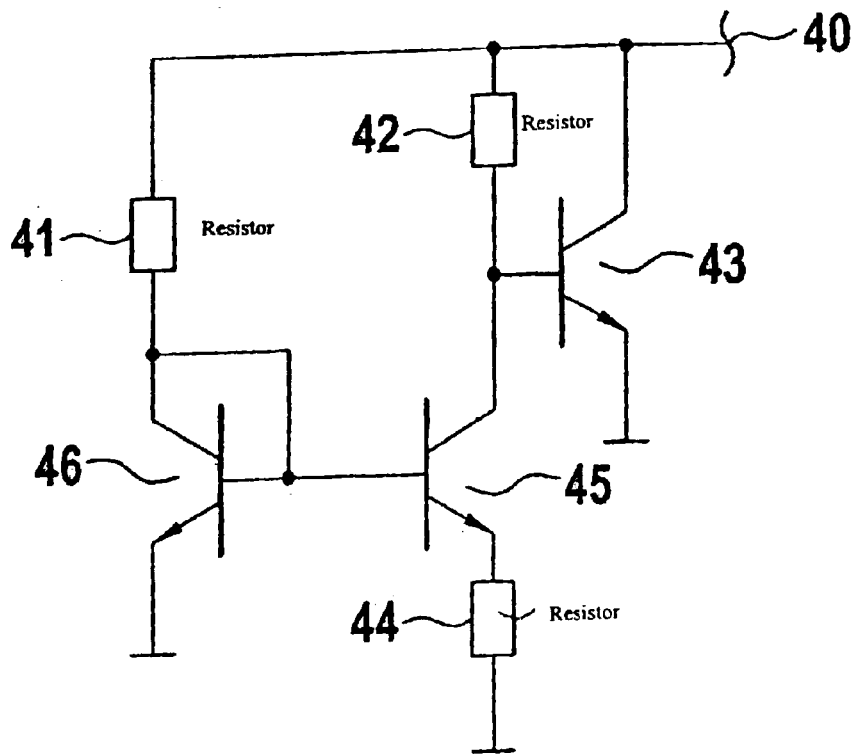
FIG. 8 shows a band gap voltage reference.

FIG. 8 shows how such a voltage source 39, 35, or 36 may be implemented. In this case it is a band gap reference. A voltage, which is a function of the band gap, is applied to output 40. This voltage is generated here using a current balancing circuit including a downstream transistor in an emitter configuration. The emitter of a transistor 46 is connected to ground and its collector is connected to a resistor 41 and to its base terminal. The base terminal of transistor 46 is also connected to the base of transistor 45, whose emitter is connected to ground via a resistor 44. The collector of transistor 45 is connected to the base of a transistor 43 and also to a resistor 42. The emitter of transistor 43 is connected to ground, while the collector is connected to voltage output 40. The other sides of resistors 42 and 41 are connected to output 40.

In the case of the band gap reference, the voltage between emitter and base is used as a reference, with a current balancing circuit including transistors 46 and 45 being the basic element. The two transistors 46 and 45 have different current densities, typically with a ratio of 10 to 1. Using resistor 42, the current of the current balancing circuit is converted into a voltage, to which the base-emitter voltage of transistor 43 is added. Using a suitable selection of resistor 42, temperature independence may be achieved if the total voltage corresponds to the band gap of silicon, or approximately 1.22 V. The output current via resistor 41 is used as the constant current required for the current balancing circuit.

Supply module 1 is configured here as an IC. It may, however, also be made of a plurality of electronic components.

What is claimed is:

1. A method of monitoring a voltage supply of a control unit in a motor vehicle, the method comprising:

interrupting a function of a component of the control unit over a RESET line upon detecting a fault in voltages generated by the supply module in the control unit, the interrupting being performed by using the supply module;

monitoring the voltages for the fault via bands and values;

initiating a test of the RESET line of the control unit;

interrupting, via the supply module, the function of the component over the RESET line for a predefined time period using periodic pulses; and counting, via a processor, a time between interrupts to monitor an operation of the RESET line.

2. The method of claim 1, wherein limits of the bands are alternately shifted above and below the values during the test to force the interrupts.

3. The method of claim 1, wherein the test is performed at each startup of the control unit.

4. The method of claim 1, wherein the component is stopped for each fault in the voltages until all monitoring functions of the supply module signal no voltage fault.

5. The method of claim 1, wherein the supply module provides a first reference voltage and a second reference voltage that are independent of one another, and the first reference voltage is used for regulating the voltages and the second reference voltage is used for monitoring a regulating voltage.

6. The method of claim 1, wherein at least one of a warning is issued and functions of the control unit are blocked for a failed test.

7. A control unit comprising:

a RESET line;

a supply module connected to a component of the control unit via the RESET line, to supply the component with required voltages;

a processor to perform the following:

interrupting a function of a component of the control unit over the RESET line upon detecting a fault in the required voltages, the interrupting being performed by the supply module;

monitoring the voltages for the fault via bands and values;

initiating a test of the RESET line of the control unit;

interrupting, via the supply module, the function of the component over the RESET line for a predefined time period using periodic pulses; and counting, via a processor, a time between interrupts to monitor an operation of the RESET line.

8. The control unit of claim 7, wherein the supply module includes a voltage supply arrangement to provide at least two independent reference voltages.

9. The control unit of claim 7, wherein the supply module includes at least two voltage sources that are independent of one another to provide at least two independent reference voltages.

10. The control unit of claim 7, wherein the supply module includes one voltage source and at least two impedance transformers to provide at least two independent reference voltages.

* * * * *